US009524781B2

(12) United States Patent
Kim et al.

(10) Patent No.: US 9,524,781 B2
(45) Date of Patent: Dec. 20, 2016

(54) NONVOLATILE MEMORY DEVICE AND OPERATING METHOD THEREOF

(71) Applicant: Samsung Electronics Co., Ltd., Suwon-Si, Gyeonggi-Do (KR)

(72) Inventors: Seung-bum Kim, Hwaseong-si (KR); Woopyo Jeong, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 250 days.

(21) Appl. No.: 14/506,841

(22) Filed: Oct. 6, 2014

(65) Prior Publication Data

US 2015/0160859 A1  Jun. 11, 2015

(30) Foreign Application Priority Data

Dec. 11, 2013  (KR) .................. 10-2013-0153988

(51) Int. Cl.
*G11C 16/04* (2006.01)
*G11C 16/10* (2006.01)
(Continued)

(52) U.S. Cl.
CPC .......... *G11C 16/10* (2013.01); *G11C 11/5628* (2013.01); *G11C 11/5642* (2013.01); *G11C 16/24* (2013.01); *G11C 16/26* (2013.01); *G11C 16/3418* (2013.01); *G11C 16/3459* (2013.01); *G06F 12/0215* (2013.01); *G06F 12/0246* (2013.01); *G06F 2212/1016* (2013.01); *G06F 2212/7203* (2013.01); *G11C 16/0483* (2013.01); *G11C 2211/5648* (2013.01)

(58) Field of Classification Search
CPC ......... G11C 16/10; G11C 16/24; G11C 16/26; G11C 16/3418; G11C 16/3459; G11C 11/5628; G11C 11/5642
USPC ............. 365/185.17, 189.05, 189.011, 233.1
See application file for complete search history.

(56) References Cited

U.S. PATENT DOCUMENTS 7,023,736 B2   4/2006  Cernea et al.
7,738,303 B2   6/2010  Park
(Continued)

FOREIGN PATENT DOCUMENTS

KR    20090104449 A   10/2009
KR    100954946 B1    4/2010
(Continued)

*Primary Examiner* — Pho M Luu
(74) *Attorney, Agent, or Firm* — Harness, Dickey & Pierce, P.L.C.

(57) ABSTRACT

A nonvolatile memory device includes a first memory cell group connected to a first word line and a first bit line group, a second memory cell group connected to the first word line and a second bit line groups (BLGs), a control logic that performs first and second program operations on the first and second memory cell groups, respectively, performs a verification operation on the first memory cell group by pre-charging bit lines in the first and second BLGs at a same time to verify the first program operation, and a verification operation on the second memory cell group by pre-charging the bit lines in the first and second BLGs at a same time to verify the second program operation, and performs a read operation on at least one of the first and second memory cell groups by simultaneously pre-charging the bit lines in the first and second BLGs.

18 Claims, 14 Drawing Sheets

(51) Int. Cl.
*G11C 11/56* (2006.01)
*G11C 16/24* (2006.01)
*G11C 16/26* (2006.01)
*G11C 16/34* (2006.01)
*G06F 12/02* (2006.01)

(56) References Cited

U.S. PATENT DOCUMENTS

| | | | |
|---|---|---|---|
| 8,169,808 B2 | 5/2012 | Roohparvar | |
| 8,169,830 B2 | 5/2012 | Moschiano et al. | |
| 8,218,365 B2 | 7/2012 | Kim et al. | |
| 8,254,181 B2 * | 8/2012 | Hwang | G11C 16/3404 |
| | | | 365/185.11 |
| 8,284,611 B2 | 10/2012 | Lee | |
| 8,493,784 B2 * | 7/2013 | Kang | G11C 11/5628 |
| | | | 365/185.03 |
| 8,724,394 B2 * | 5/2014 | Choe | G11C 16/0483 |
| | | | 365/185.2 |
| 8,958,251 B2 * | 2/2015 | Kwon | G11C 16/10 |
| | | | 365/185.11 |
| 8,971,114 B2 * | 3/2015 | Kang | G11C 16/0483 |
| | | | 365/185.11 |
| 9,165,672 B2 * | 10/2015 | Kang | G11C 7/1039 |
| 2004/0109357 A1 | 6/2004 | Cernea et al. | |
| 2008/0159004 A1 | 7/2008 | Hemink et al. | |
| 2009/0190404 A1 | 7/2009 | Roohparvar | |
| 2009/0244967 A1 | 10/2009 | Kim et al. | |
| 2009/0290427 A1 | 11/2009 | Park | |
| 2010/0329031 A1 | 12/2010 | Lee | |
| 2011/0063920 A1 | 3/2011 | Moschiano et al. | |
| 2012/0218822 A1 | 8/2012 | Roohparvar | |
| 2012/0294088 A1 | 11/2012 | Tanaka | |

FOREIGN PATENT DOCUMENTS

| | | |
|---|---|---|
| KR | 20110001075 A | 1/2011 |
| KR | 20130079853 A | 7/2013 |

* cited by examiner

NONVOLATILE MEMORY DEVICE AND OPERATING METHOD THEREOF

CROSS-REFERENCE TO RELATED APPLICATIONS

A claim for priority under 35 U.S.C. §119 is made to Korean Patent Application No. 10-2013-0153988 filed Dec. 11, 2013, in the Korean Intellectual Property Office, the entire contents of which are hereby incorporated by reference.

BACKGROUND

At least some example embodiments of the inventive concepts described herein relate to a semiconductor memory device, and more particularly, relate to a nonvolatile memory device and its operating method.

Semiconductor memory devices may be volatile or nonvolatile. The volatile semiconductor memory devices may perform read and write operations at a high speed, but contents stored therein may be lost at power-off. The nonvolatile semiconductor memory devices may retain contents stored therein even at power-off. The nonvolatile semiconductor memory devices may be used to store contents which must be retained regardless of whether they are powered.

The nonvolatile semiconductor memory devices may include a mask read-only memory (MROM), a programmable read-only memory (PROM), an erasable programmable read-only memory (EPROM), an electrically erasable programmable read-only memory (EEPROM), and the like.

A flash memory device may be a typical nonvolatile semiconductor memory device. The flash memory device may be widely used as a voice and image data storing medium of information appliances such as a computer, a cellular phone, a PDA, a digital camera, a camcorder, a voice recorder, an MP3 player, a handheld PC, a game machine, a facsimile, a scanner, a printer, and the like.

As a demand on high integration of a memory device increases, there is being used a multi-bit memory device, which stores multiple bits in a memory cell.

SUMMARY

At least some example embodiments of the inventive concepts provide a nonvolatile memory device including a plurality of memory cells including, a first memory cell group connected to a first word line and a first bit line group, bit lines in the first bit line group being adjacent to each other, a second memory cell group connected to the first word line and a second bit line group, bit lines in the second bit line group being adjacent to each other; a page buffer circuit configured to sense memory cells connected to the first word line via the first and second bit line groups; and a control logic configured to perform a first program operation with respect to the first memory cell group and perform a second program operation with respect to the second memory cell group, the control logic being configured such that after the control logic performs the first program operation with respect to the first memory cell group, the control logic performs a first verification operation with respect to the first memory cell group by pre-charging bit lines in the first and second bit line groups at a first same time to verify the first program operation, the control logic being configured such that after the control logic performs the second program operation with respect to the second memory cell group, the control logic performs a second verification operation with respect to the second memory cell group by pre-charging the bit lines in the first and second bit line groups at a second same time to verify the second program operation, the control logic being configured such that, when the control logic performs a read operation on at least one of the first memory cell group and the second memory cell group, the control logic simultaneously pre-charges the bit lines in the first and second bit line groups to perform the read operation.

According to at least some example embodiments, the number of bit lines in the first bit line group is equal to the number of bit lines in the second bit line group.

According to at least some example embodiments, the control logic controls the page buffer circuit according to a predetermined or, alternatively, desired number of program (NOP) such that the first memory group is first programmed and the second memory cell group is next programmed.

According to at least some example embodiments, during the read operation, the control logic controls the page buffer circuit so as to sense the first and second memory cell groups and to output the sensed result according to a full page read mode or a partial page read mode.

According to at least some example embodiments, at the partial page read mode, the page buffer circuit simultaneously pre-charges and senses the bit lines of the first and second bit line groups.

According to at least some example embodiments, at the partial page read mode, the page buffer circuit outputs data sensed from one, selected according to a read request, from among the first and second memory cell groups.

According to at least some example embodiments, the control logic allocates first physical addresses to the bit lines of the first bit line group and second physical addresses to the bit lines of the second bit line group.

According to at least some example embodiments, the first physical addresses are sequentially addressed to first logical addresses of write-requested data.

According to at least some example embodiments, the second physical addresses are sequentially addressed to second logical addresses of write-requested data, and the second logical addresses are addressed following the first logical addresses.

A least some example embodiments of the inventive concepts provide an operating method of a nonvolatile memory device which includes a first memory cell group that is connected to a selected word line and a first bit line group, bit lines in the first bit line group being adjacent to each other; a second memory cell group that is connected to the selected word line and a second bit line group, bit lines in the second bit line group being adjacent to each other; a page buffer circuit configured to sense memory cells connected to the selected word line via the first and second bit line groups; and control logic configured to control the page buffer circuit, the operating method including performing a first program operation with respect to the first memory cell group; pre-charging bit lines in the first and second bit line groups at the same time to perform a first verification operation with respect the first memory cell to verify the first program operation, after performing the first program operation; performing a second program operation with respect to the second memory cell group, after verifying the first program operation; pre-charging the bit lines in the first and second bit line groups at the same time to perform a second verification operation with respect to the second memory cell to verify the second program operation, after performing the second program operation; and performing a read operation, the read operation including simultaneously pre-charging the bit lines in the first and second bit line groups. According to at least some example embodiments, the number of bit lines in the first bit line group is equal to the number of bit lines in the second bit line group.

According to at least some example embodiments, based on a predetermined or, alternatively, desired number of program (NOP), the first memory group is first programmed and the second memory cell group is next programmed.

According to at least some example embodiments, during the read operation, data stored in the first and second memory cell groups is output according to a full page read mode or a partial page read mode.

According to at least some example embodiments, during the partial page read mode, all data stored in the first and second memory cell groups is sensed, and wherein data, corresponding to one of the first or second memory cell group, from among the sensed data is output.

According to at least some example embodiments, physical addresses appointing bit lines of the first and second bit line groups are sequentially addressed to logical addresses of write-requested data.

At least some example embodiments of the inventive concepts provide a nonvolatile memory device including a plurality of memory cells including, a first group of memory cells having adjacent first bit lines, respectively, and each being connected to a first word line, and a second group of memory cells having adjacent second bit lines, respectively, and each being connected to the first word line; and a control circuit configured to control performance of, a first program operation to program the first group of memory cells, a first verification operation to verify the first program operation, a second program operation to program the second group of memory cells, after the first verification operation, a second verification operation to verify the second program operation, and a read operation to read data from one or more cells from at least one of the first and second groups of memory cells, the control circuit being configured control performance of a unified pre-charge operation during each of the first verification operation, the second verification operation, and the read operation, respectively, the unified pre-charge operation being a pre-charge operation in which both the adjacent first bit lines and the adjacent second bit lines are pre-charged at the same time.

According to at least one example embodiment, the nonvolatile memory device further includes a page buffer connected to the first and second adjacent bit lines, the control circuit being configured to control the page buffer to perform the first, second and third unified pre-charging operations.

According to at least one example embodiment, the read operation is a partial-read operation that includes outputting selected data read from only a selected group, the selected group being only one of the first group of memory cells and the second group of memory cells, the selected data being read based on the third unified pre-charge operation.

BRIEF DESCRIPTION OF THE FIGURES

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

DETAILED DESCRIPTION

Figure 1:
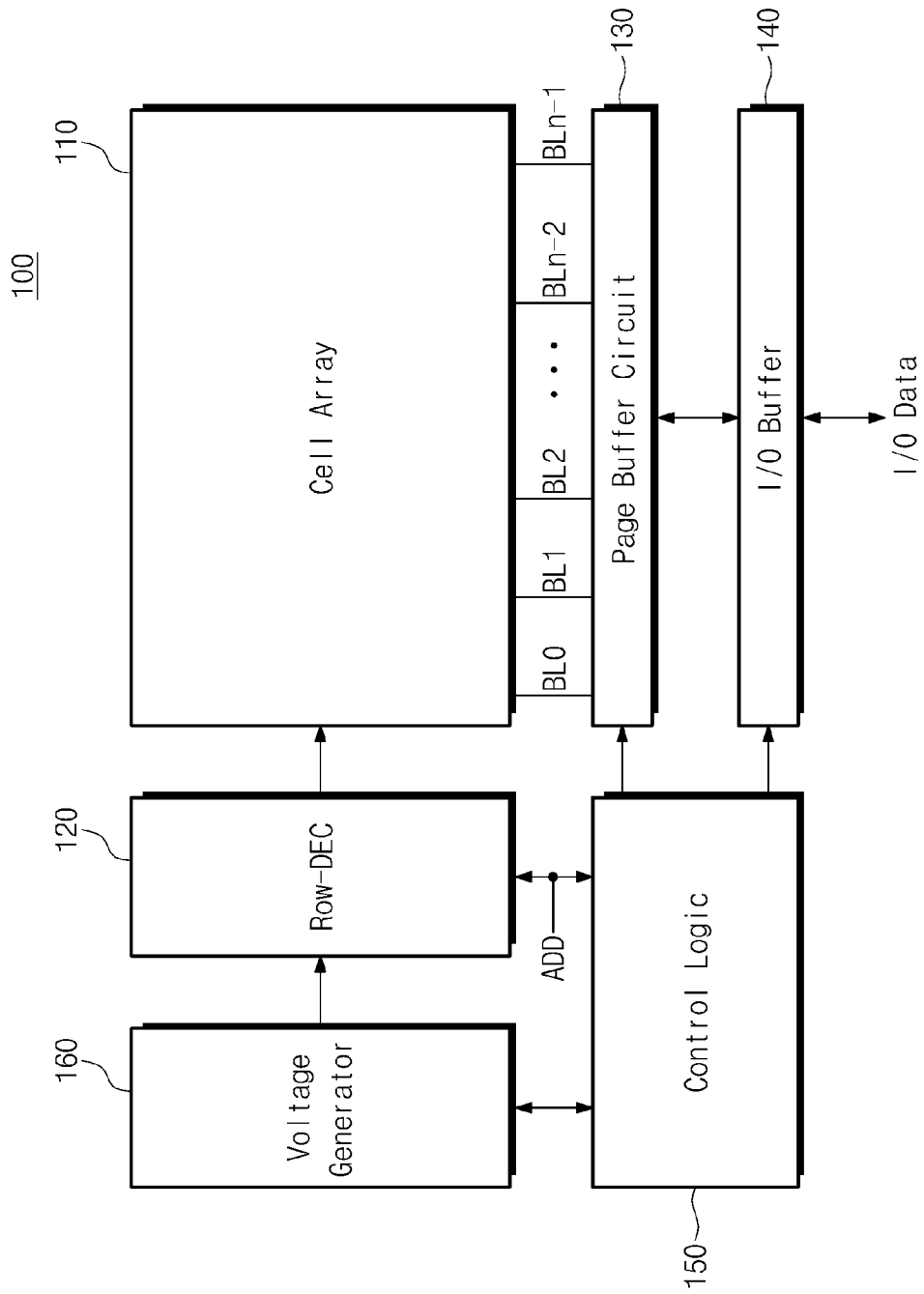
FIG. 1 is a block diagram schematically illustrating a nonvolatile memory device according to at least one example embodiment of the inventive concepts.

Detailed example embodiments of the inventive concepts are disclosed herein. However, specific structural and functional details disclosed herein are merely representative for purposes of describing example embodiments of the inventive concepts. Example embodiments of the inventive concepts may, however, be embodied in many alternate forms and should not be construed as limited to only the embodiments set forth herein.

Accordingly, while example embodiments of the inventive concepts are capable of various modifications and alternative forms, embodiments thereof are shown by way of example in the drawings and will herein be described in detail. It should be understood, however, that there is no intent to limit example embodiments of the inventive concepts to the particular forms disclosed, but to the contrary, example embodiments of the inventive concepts are to cover all modifications, equivalents, and alternatives falling within the scope of example embodiments of the inventive concepts. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concepts. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the inventive concepts. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a block diagram schematically illustrating a nonvolatile memory device 100 according to at least one example embodiment of the inventive concepts. Referring to FIG. 1, a nonvolatile memory device 100 includes a cell array 110, a row decoder 120, a page buffer circuit 130, an input/output buffer 140, control logic 150, and a voltage generator 160.

The cell array 110 is connected to the row decoder 120 via word lines and selection lines. The cell array 110 is connected to the page buffer circuit 130 via bit lines BL0 to BLn−1. The cell array 110 may include a plurality of NAND cell strings, each of which may have a channel formed in a vertical or horizontal direction. The word lines of the cell array 110 may be stacked in the vertical direction. The cell array 110 according to at least one example embodiment of the inventive concepts may have the All-Bit-Line (hereinafter, referred to as "ABL") structure. In the ABL structure, a bit line may be connected to a page buffer; hence, memory cells connected to a word line may be programmed at the same time.

The row decoder 120 selects one of memory blocks of the cell array 110 in response to an address ADD. The row decoder 120 selects one of word lines of the selected memory block. The row decoder 120 may provide a voltage from the voltage generator 160 to a word line of the selected memory block. During a program operation, the row decoder 120 may provide a selected word line with a program voltage Vpgm and a verification voltage Vvfy and unselected word lines with a pass voltage Vpass. During a read operation, the row decoder 120 may provide a selection read voltage Vrd to the selected word line and a non-selection read voltage Vread to the unselected word lines.

The page buffer circuit 130 may operate as a write driver or a sense amplifier according to an operating mode. During a program operation, the page buffer circuit 130 may transfer a bit line voltage corresponding to data to be programmed to a bit line of the cell array 110. During a read operation, the page buffer circuit 130 may sense data stored in a selected memory cell via a bit line. The page buffer circuit 130 latches the sensed data to transfer it to the input/output buffer 140. The page buffer circuit 130 may include a plurality of page buffers respectively connected to the bit lines BL0 to BLn−1.

The page buffer circuit 130 according to at least one example embodiment of the inventive concepts is connected to the cell array 110 with the ABL structure. The page buffer circuit 130 allocates column addresses according to a physical order of bit lines. During a program operation about a selected word line, the page buffer circuit 130 transfers bit line voltages to adjacent bit lines at the same time; so, bit line coupling is reduced. During a verification operation following the program operation about the selected word line, the page buffer circuit 130 pre-charges all bit lines BL0 to BLn−1 to perform a verification operation.

The page buffer circuit 130 reads all data of a selected page, for example, at the same time. This read mode is a full page read mode. During a read operation, the page buffer circuit 130 selects and reads a part of the selected page. This read mode is a partial page read mode. To perform a read operation, the page buffer circuit 130 according to at least one example embodiment of the inventive concepts pre-charges all the bit lines BL0 to BLn−1 during a read operation regardless of a page read mode. As bit line pre-charging methods for the verification operation and the read operation are unified, data is sensed via a one-shot read operation regardless of a page read mode. For example, according to at least one example embodiment of the inventive concepts, the bit line pre-charging method for the verification operation may be unified in the sense that all bit-lines BL0-BLn−1 are pre-charged at the same time such that data can be sensed from all the bit lines BL0 to BLn−1 at the same time. Further, according to at least one example embodiment of the inventive concepts, the bit line pre-charging method for the read operation may be unified in the sense that all bit-lines BL0-BLn−1 are pre-charged at the same time such that data can be sensed from all the bit lines BL0 to BLn−1 at the same time.

The partial page read mode may be divided into modes: a half page read mode in which half the memory cells included in a selected page are read and a quarter page read mode in which a quarter of memory cells included in a selected page are read. However, at least some embodiments of the inventive concepts are not limited thereto. According to at least some example embodiments, the half page read mode may be used as an example of the partial page read mode.

During a program operation, the input/output buffer 140 transfers input write data to the page buffer circuit 130. During a read operation, the input/output buffer 140 outputs read data provided from the page buffer circuit 130 to an external device. The input/output buffer 140 transfers input addresses ADD or commands CMD to the control logic 150 or the row decoder 120.

The control logic 150 controls the page buffer circuit 130 and the voltage generator 160 in response to a command CMD and an address ADD from the input/output buffer 140.

During a verification operation, the control logic 150 controls the voltage generator 160 such that the verification voltage Vvfy is supplied to a selected word line. During a read operation, the control logic 150 controls the voltage generator 160 such that a selection read voltage Vrd is supplied to a selected word line. At a verification operation and at a read operation, the control logic 150 controls the page buffer circuit 130 such that all bit lines BL0 to BLn−1 are pre-charged.

For example, during a program operation, the control logic 150 controls the voltage generator 160 such that the program voltage Vpgm is supplied to a selected word line and such that the pass voltage Vpass is supplied to unselected word lines. During the program operation, the control logic 150 controls the page buffer circuit 130 to perform a program operation according to a number of program (hereinafter, referred to as "NOP"). Under the control of the control logic 150, bit lines may be addressed according to a physical order.

During a verification operation, the control logic 150 controls the voltage generator 160 such that the verification voltage Vvfy is provided to a selected word line and such that the pass voltage Vpass is transferred to unselected word lines. During the verification operation, the control logic 150 controls the page buffer circuit 130 such that all bit lines BL0 to BLn−1 are pre-charged. Thus, the nonvolatile memory device 100 according to at least one example embodiment of the inventive concepts performs a verification operation with all bit lines BL0 to BLn−1 pre-charged.

During a read operation, the control logic 150 controls the voltage generator 160 such that the selection read voltage Vrd is supplied to a selected word line and such that the non-selection read voltage Vread is provided to unselected word lines. During the read operation, the control logic 150 controls the page buffer circuit 130 such that all bit lines BL0 to BLn−1 are pre-charged. Thus, under the control of the control logic 150, the page buffer circuit 130 pre-charges all bit lines BL0 to BLn−1 at verification operation and at a read operation.

Under the control of the control logic 150, the voltage generator 160 generates a variety of word line voltages to be supplied to word lines and a voltage to be supplied to a bulk (e.g., a well area) where memory cells are formed. For example, a variety of word line voltages to be supplied to word lines may include the program voltage Vpgm, the verification voltage Vvfy, the pass voltage Vpass, and the selection and non-selection read voltages Vrd and Vread. The voltage generator 160 further generates selection line voltages VSSL and VGSL to be supplied to the selection lines SSL and GSL during read and program operations.

The nonvolatile memory device 100 pre-charges all bit lines BL0 to BLn−1 in the same manner both at a read operation and at a verification operation. If all bit lines BL0 to BLn−1 are pre-charged, then common source line noise increases. Nevertheless, if bit line sensing methods for verification and read operations are unified, the page buffer circuit 130 senses memory cells via only a read operation; hence, a read operating speed of the nonvolatile memory device 100 is improved. With the above description, the nonvolatile memory device 100 sequentially addresses adjacent bit lines according to a physical order. When the adjacent bit lines are sequentially addressed according to a physical order and when the NOP is two or more, adjacent bit lines have the same voltage level at a program operation. If voltage levels of adjacent bit lines are identical to one another during a program operation, bit line coupling is reduced.

Figure 2:
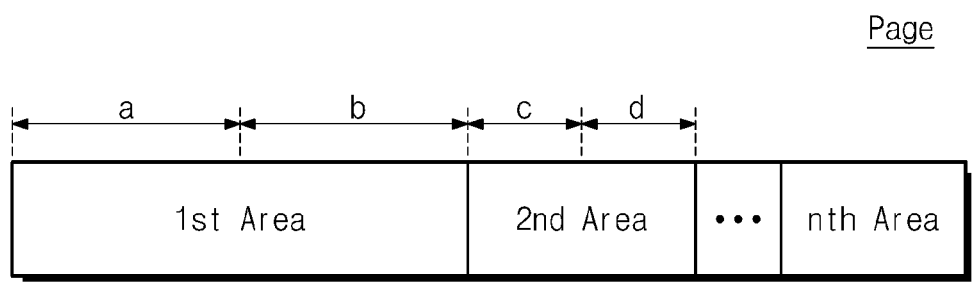
FIG. 2 is a diagram schematically illustrating a unit page of a cell array shown in FIG. 1.

FIG. 2 is a diagram schematically illustrating a unit page of a cell array shown in FIG. 1. Referring to FIG. 2, a unit page includes a plurality of areas, each of which may consist of a plurality of memory cells (not shown). Each memory cell may be a single level cell (SLC) or a multi-level cell (MLC).

A nonvolatile memory device 100 according to at least one example embodiment of the inventive concepts may be configured to secure the NOP about the unit page before erasing. For example, if the NOP is 1, a program operation performed on the unit page may be performed on the entire unit page at the same time. If the NOP is 4, the unit page is divided into four specific areas, the four specific areas are independently programmed. For example, the unit page is programmed four times if the NOP is 4. For example, according to at least one example embodiment, the NOP represents the number of programming areas of a unit page into which data is programmed when the unit page is programmed, and a number of independent programming operations performed when the unit page is programmed, where the independent programming operations are performed on the programming areas, respectively.

When a program voltage is provided to a word line connected to memory cells that are previously programmed, a threshold voltage distribution of memory cells widens. This means that threshold voltages of memory cells may be varied due to bit line coupling.

First and second areas may be programmed to correspond to the NOP. For example, if the NOP is 2, memory cells in the first and second areas are divided into first and second groups based on an address provided from an external device. For example, the $1^{st}$ area illustrated in FIG. 2 may be divided into first and second programming areas as illustrated by the letters "a" and "b", and the $2^{nd}$ area illustrated in FIG. 2 may also be divided into the first and second programming areas as illustrated by the letters "c" and "d". After the first group of memory cells is programmed, the second group of memory cells is programmed. For example, after the first programming area are programmed, the second programming area may be programmed. That is, a program operation is performed two times. For example, after memory cells, corresponding to "a" and "c" (i.e., the first programming area), from among memory cells included in the unit page are programmed, memory cells, corresponding to "b" and "d" (i.e., the second programming area), from among the memory cells included in the unit page are programmed. Alternatively, after memory cells, corresponding to "a" and "b", from among memory cells included in the unit page are programmed, memory cells, corresponding to "c" and "d", from among the memory cells included in the unit page are programmed. Thus, according to at least one example embodiment, because the NOP is 2 (two) in the example illustrated in FIG. 2, data is programmed into the unit page by performing two programming operations on two programming areas of the unit page, respectively.

Figure 3:
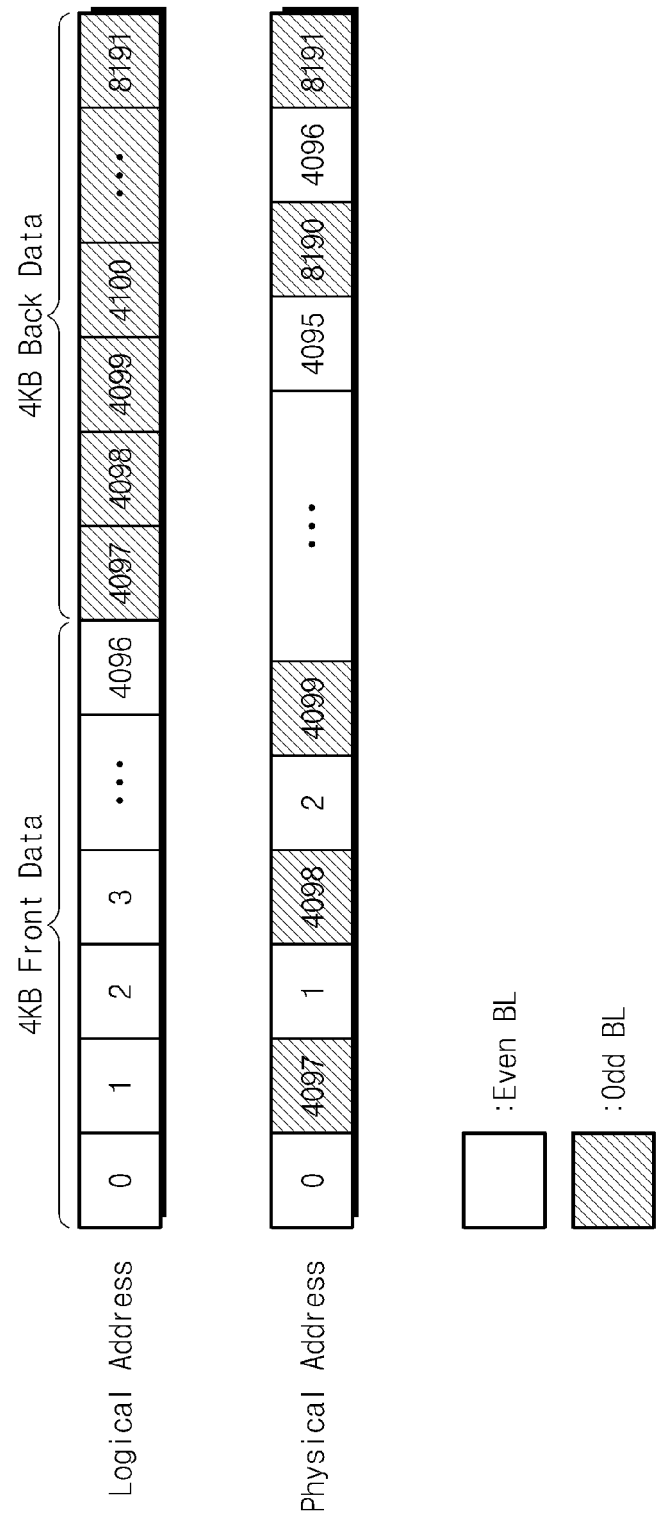
FIG. 3 is a diagram schematically illustrating a typical bit line addressing method.

FIG. 3 is a diagram schematically illustrating a typical bit line addressing method. Referring to FIG. 3, there is shown a column addressing method associated with the ABL structure in which an entire page with an 8-KB size is programmed at the same time. Also, the column addressing method is associated with the NOP of 2.

Front data has a logical address range from 0 to 4096. Even-numbered bit lines BL0, BL2, BL4 . . . BL8186, BL8188, and BL8190 are addressed to logical addresses 0 to 4096 of the front data, respectively. Back data has a logical address range from 4097 to 8191. Odd-numbered bit lines BL1, BL3, BL5 . . . BL8187, BL8189, and BL8191 are addressed to logical addresses 4097 to 8191 of the back data, respectively. Bit lines that are to be selected at the same time during a program operation and a read operation may be selected according to an addressing order.

For example, in the event that the NOP is 2, during a program operation, memory cells corresponding to even-numbered bit lines are first programmed, and memory cells corresponding to odd-numbered bit lines are next programmed. Also, during a partial page read mode, the even-numbered bit lines or the odd-numbered bit lines are selected to perform a read operation. During a partial page read mode in which the even-numbered bit lines are selected, data sensed via the even-numbered bit lines form a plurality of selectors being continuous. Thus, data sensed via the even-numbered bit lines is output regardless of whether or not a sensing operation via the odd-numbered bit lines is performed.

If a read operation is performed via either the even-numbered bit lines or the odd-numbered bit lines during a partial page read mode, data of memory cells is sensed using a one-time read operation. However, during a full page read mode, data of memory cells is sensed via a read operation performed in a coarse-fine sensing manner. That is, a read operation is performed two times during the full page read mode; hence, a time taken to perform the read operation increases. Also, bit line coupling generated during a program operation lowers program performance.

Figure 4:
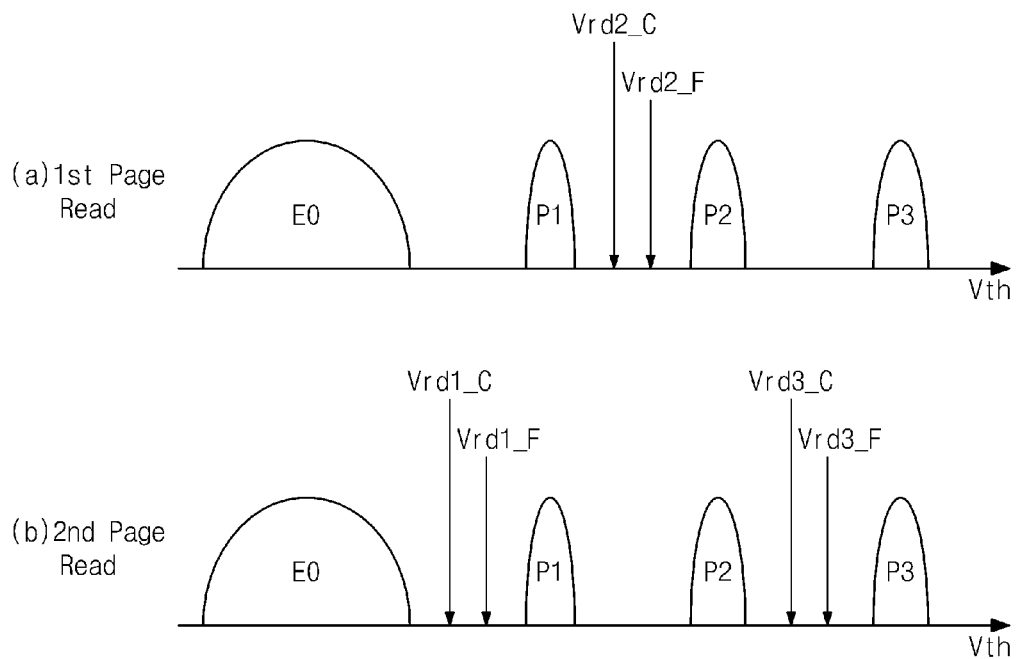
FIG. 4 is a diagram for describing a typical coarse-fine sensing method.

FIG. 4 is a diagram for describing a typical coarse-fine sensing method. Referring to FIG. 4, during a full page read mode, a voltage generator 160 generates read voltages Vrd1_C, Vrd1_F, Vrd2_C, Vrd2_F, Vrd3_C, and Vrd3_F for coarse-fine sensing. For ease of description, an operation corresponding to the full page read mode will be described using a 2-bit MLC. In the event that memory cells corresponding to even-numbered bit lines and memory cells corresponding to odd-numbered bit lines are sequentially programmed according to the NOP of 2, a coarse-fine sensing method is used at the full page read mode.

Referring to a case (a) corresponding to a first page (or, MSB page) read operation, the voltage generator 160 generates a coarse read voltage Vrd2_C for coarse sensing. The coarse read voltage Vrd2_C thus generated is provided to a selected word line via a row decoder 120. Afterwards, a page buffer circuit 130 senses bit lines of selected memory cells. The page buffer circuit 130 selects memory cells that remain at a turn-off state when the coarse read voltage Vrd2_C is provided to the selected word line. The coarse sensing may be used to select off cells when a relatively low coarse read voltage Vrd2_C is provided.

The nonvolatile memory device 100 may perform a fine sensing of memory cells selected via the coarse sensing. Memory cells with threshold voltages lower than the coarse read voltage Vrd2_C are selected via the coarse sensing, and fine sensing with respect to the selected memory cells is performed using a fine read voltage Vrd2_F. The voltage generator 160 generates the fine read voltage Vrd2_F for fine sensing. The row decoder 120 transfers the fine read voltage Vrd2_F to a selected word line. The page buffer circuit 130 senses and latches data stored in memory cells. The page buffer circuit 130 output data sensed via the fine sensing, as data read out from the selected memory cells.

All bit lines are simultaneously selected and sensed during a full page read mode. Thus, common source line noise increases relatively. In contrast, as the coarse-fine sensing is performed, the common source line noise decreases. That is, off cells are first selected via the coarse sensing, and fine sensing about the selected off cells is next performed. Thus, the common source line noise generated when all bit lines are selected is reduced or, alternatively, blocked because data read via the fine sensing is output. However, the coarse-fine sensing necessitates coarse sensing and fine sensing. That is, a read operation using the coarse-fine sensing manner is performed two times; hence, a read time increases.

Referring to a case (b) corresponding to a second page read operation, the coarse-fine sensing is performed as follows.

At a read operation for discrimination between an erase state E0 and a program state P1, a nonvolatile memory device 100 performs coarse-fine sensing using read voltages Vrd1_C and Vrd1_F. At a read operation for discrimination between a program state P2 and a program state P3, the nonvolatile memory device 100 performs coarse-fine sensing using read voltages Vrd3_C and Vrd3_F. The second page read operation is different from the first page read operation in that it is performed to read an LSB page and in that levels of read voltages Vrd1_C, Vrd1_F, Vrd3_C, and Vrd3_F are different from those of read voltages Vrd2_C and Vrd2_F. A basic procedure of the second page read operation is equal to that of the first page read operation except for the above-description difference, and a description thereof is thus omitted.

With the coarse-fine sensing, all bit lines are pre-charged at coarse sensing. During the coarse sensing, off cells are only selected using relatively low coarse read voltages Vrd1_C, Vrd2_C, and Vrd3_C. During the fine sensing following the coarse sensing, off cells selected via the coarse sensing are sensed. Bit lines corresponding to off cells selected via the coarse sensing are only pre-charged at the fine sensing. As the coarse-fine sensing is employed, common source line noise due to simultaneous selection of all bit lines in the ABL structure is blocked. However, the coarse-fine sensing necessitates coarse sensing and fine sensing. That is, a read operation using the coarse-fine sensing manner is performed two times; hence, a read time increases.

Figure 5:
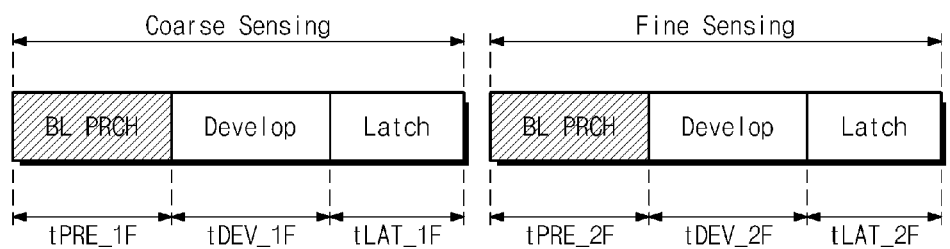
FIG. 5 is a timing diagram schematically illustrating a typical coarse-fine sensing manner.

FIG. 5 is a timing diagram schematically illustrating a typical coarse-fine sensing manner. Referring to FIG. 5, a full page read mode includes coarse sensing and fine sensing.

Each of the coarse sensing and fine sensing includes a bit line pre-charge period, a development period, and a latch period. At the coarse sensing, all bit lines are pre-charged during a pre-charge time tPRE_1F. During a development time tDEV_1F, currents of the pre-charged bit lines vary according to whether or not memory cells are programmed. During a latch time tLAT_1F, variations of bit line currents are sensed and latched in page buffers PB0 to PBn−1. Off cells are selected based on data latched via the coarse sensing. Fine sensing about the off cells thus selected is performed.

For the fine sensing, bit lines of memory cells selected via the coarse sensing are selected. The selected bit lines are pre-charged during a pre-charge time tPRE_2F. During a development time tDEV_2F, currents of the pre-charged bit lines vary according to whether or not memory cells are programmed. During a latch time tLAT_2F, variations of bit line currents are sensed and latched in the page buffers PB0 to PBn−1. At this time, data stored in the page buffers PB0 to PBn−1 is output as read data.

In general, a program operation is performed with respect to even-numbered bit lines and with respect to odd-numbered bit lines, independently. Likewise, a verification operation is performed with respect to the even-numbered bit lines and with respect to the odd-numbered bit lines, independently. For this reason, a bit line sensing method at the verification operation is different from a bit line sensing method at the read operation. As coarse-fine sensing is employed because of a difference between a bit line pre-charging method for a verification operation and a bit line pre-charging method for a read operation, a read time increases.

Figure 6:
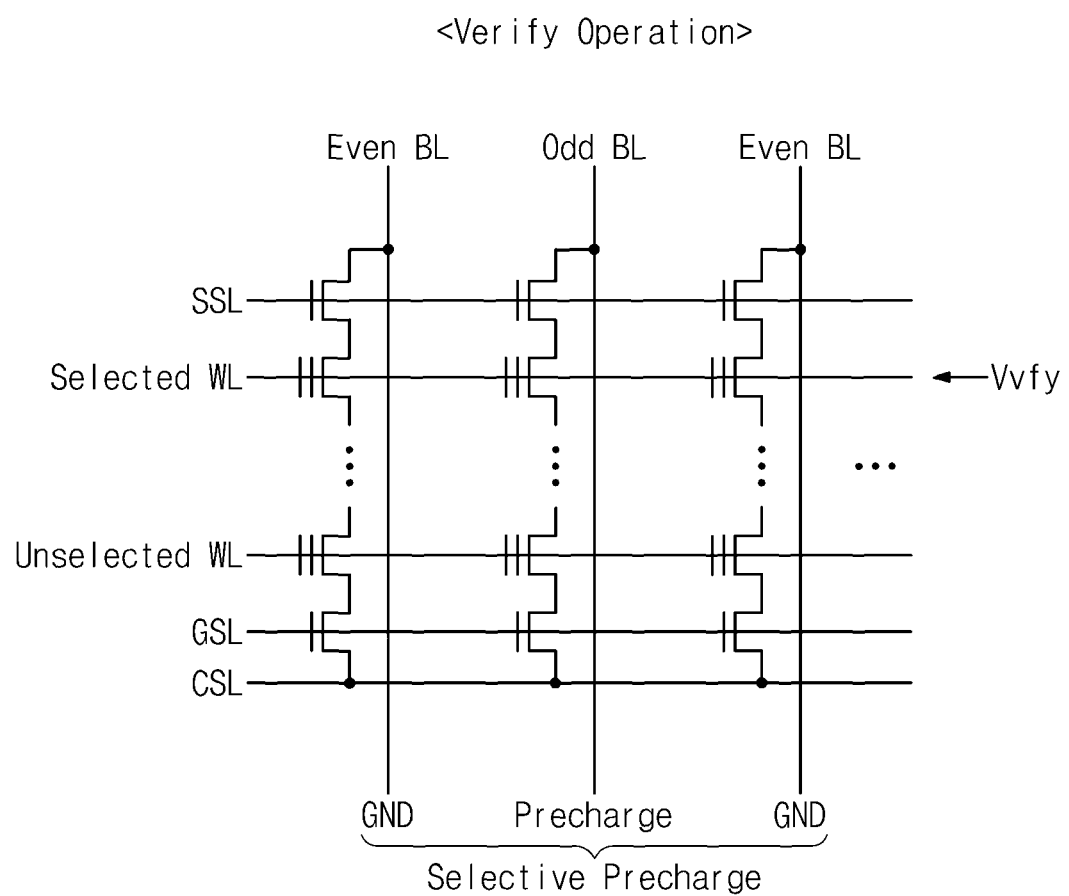
FIG. 6 is a diagram schematically illustrating a verification operation using selective pre-charging.

FIG. 6 is a diagram schematically illustrating a verification operation using selective pre-charging. In the example illustrated in FIG. 6, a verification operation performed with respect to even-numbered bit lines is independent from that performed with respect to odd-numbered bit lines. With a typical program method, if the NOP is 2, a program operation performed with respect to the even-numbered bit lines and a program operation performed with respect to the odd-numbered bit lines are performed independently. This means that a verification operation performed with respect to the even-numbered bit lines is independent from that performed with respect to the odd-numbered bit lines. In FIG. 6, there is illustrated an example in which a verification operation is performed after execution of a program operation performed with respect to the odd-numbered bit lines.

At a verification operation, a voltage generator 160 generates a verification voltage Vvfy to be supplied to a selected word line. A page buffer circuit 130 pre-charges odd-numbered bit lines. The page buffer circuit 130 grounds even-numbered bit lines. The page buffer circuit 130 only senses the odd-numbered bit lines. During the verification operation, the page buffer circuit 130 senses selected bit lines using selective pre-charging. Thus, adjacent bit lines have different voltage levels. Although not shown in figures, a verification operation performed with respect to the even-numbered bit lines is performed in the same manner as the odd-numbered bit lines.

Figure 7:
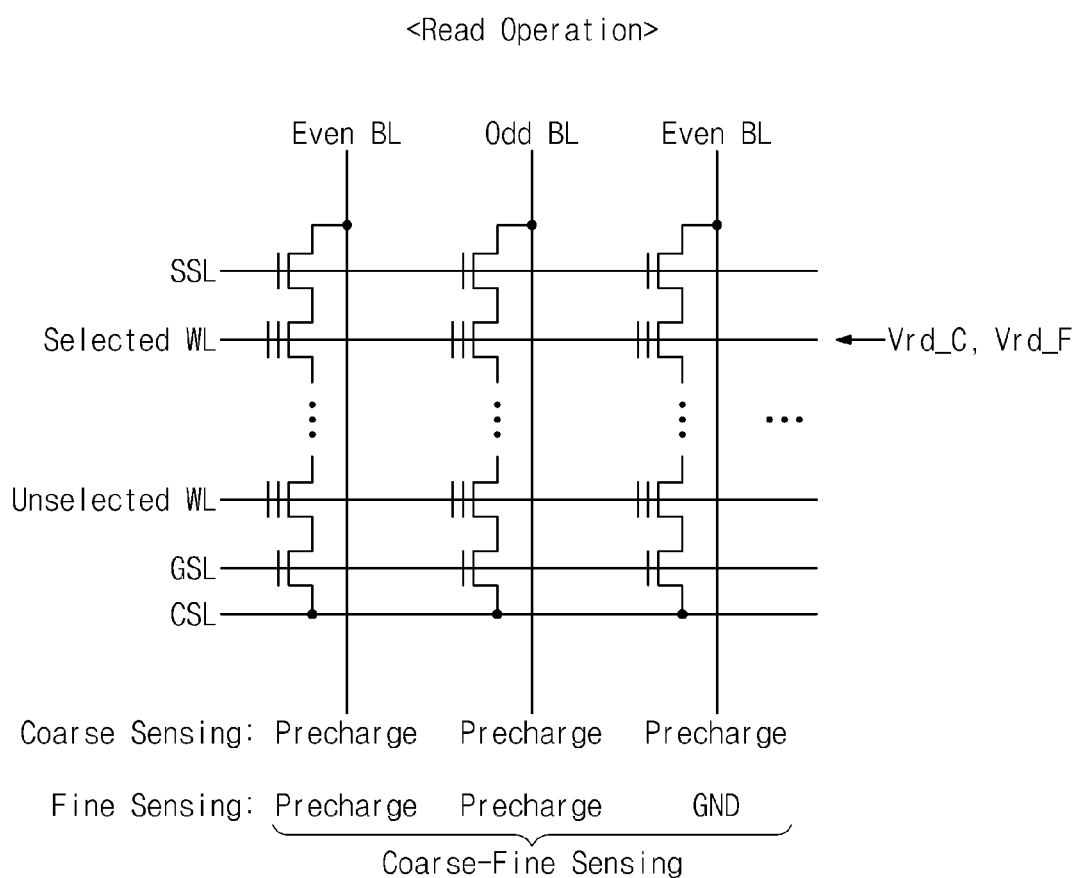
FIG. 7 is a diagram schematically illustrating a read operation using coarse-fine sensing.

FIG. 7 is a diagram schematically illustrating a read operation using coarse-fine sensing. In FIG. 7, there is illustrated an example in which after performing a verification operation using selective pre-charging described with reference to FIG. 6, a nonvolatile memory device 100 carries out a read operation at a full page read mode.

At a full page read mode, the nonvolatile memory device 100 performs a read operation using coarse-fine sensing. During coarse sensing, a voltage generator 160 generates a coarse read voltage Vrd_C to be supplied to a selected word line. A page buffer circuit 130 pre-charges and senses all bit lines BL0 to BLn−1. The page buffer circuit 130 selects off cells via the coarse sensing. During fine sensing, the voltage generator 160 generates a fine read voltage Vrd_F to be provided to the selected word line. The page buffer circuit 130 only pre-charges bit lines selected via the coarse sensing.

At the full page read mode, coarse sensing is markedly influenced by common source line noise because all bit lines are pre-charged. Thus, fine sensing is further performed for an accurate read operation. For this reason, this coarse-fine sensing causes an increase in a read time.

Although not shown in figures, fine sensing is only performed at a partial page read mode. At the partial page read mode, the nonvolatile memory device 100 only performs the fine sensing. The voltage generator 160 generates a fine read voltage Vrd_F to be provided to a selected word line. The page buffer circuit 130 only pre-charges selected bit lines. The selected bit lines may be even-numbered bit lines or odd-numbered bit lines. Thus, adjacent bit lines have different voltage levels at the partial page read mode. As common source line noise decreases, data is sensed from memory cells by performing a read operation once.

Figure 8:
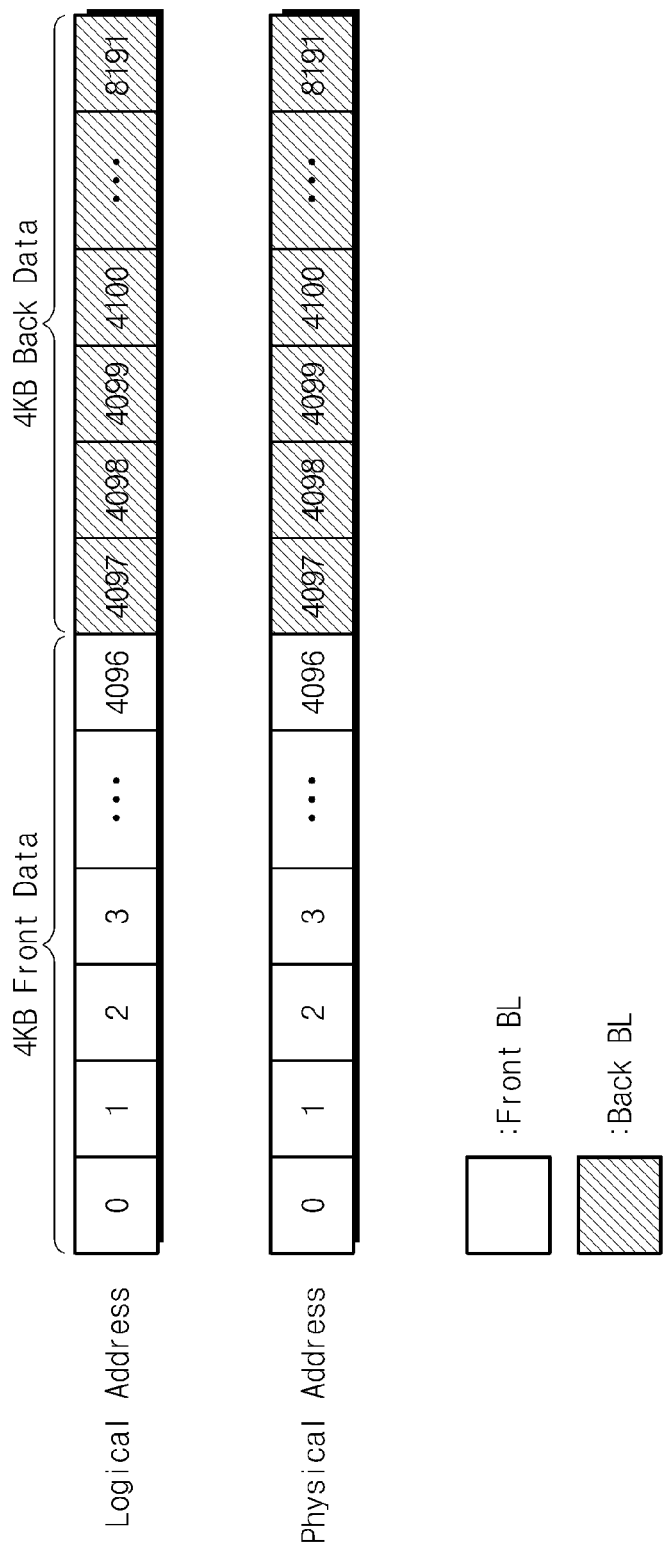
FIG. 8 is a diagram schematically illustrating a bit line addressing method according to at least one example embodiment of the inventive concepts.

FIG. 8 is a diagram schematically illustrating a bit line addressing method according to at least one example embodiment of the inventive concepts. Referring to FIG. 8, there is illustrated a column addressing method about the ABL structure in which an entire page with an 8-KB size is programmed at the same time. Also, the column addressing method is associated with an example in which the NOP is 2.

Front data has a logical address range from 0 to 4096. Front bit lines BL0, BL1, BL2 . . . BL4095, and BL4096 are addressed to logical addresses 0 to 4096 of the front data, respectively. Back data has a logical address range from 4097 to 8191. Back bit lines BL4097, BL4098, BL4099 . . . BL8190, and BL8191 are addressed to logical addresses 4097 to 8191 of the back data, respectively.

For example, in the event that the NOP is 2, during a program operation, memory cells corresponding to the front bit lines are first programmed, and memory cells corresponding to the back bit lines are next programmed. During a verification operation, all bit lines are pre-charged and sensed. Also, during a partial page read mode in which the front bit lines are selected, data sensed via the front bit lines forms a plurality of selectors being continuous. A page buffer circuit 130 senses all bit lines BL0 to BL8191 to output the sensed data via the front bit lines. Thus, adjacent bit lines are addressed according to a physical order.

If adjacent bit lines are addressed according to a physical order, they are simultaneously programmed; hence, it is possible to prevent bit line coupling. Program performance of a nonvolatile memory device 100 is improved because bit line coupling is prevented. If the bit line coupling is prevented, the nonvolatile memory device 100 performs a program operation using the same program voltage Vpgm regardless of front bit lines or back bit lines. Also, if adjacent bit lines are simultaneously programmed, all bit lines are pre-charged for a verification operation. In the event that all bit lines are pre-charged for a verification operation, data is sensed from memory cells using a read operation once by pre-charging all bit lines at a read operation, regardless of a read mode. If bit line pre-charging methods for verification and read operations are unified, data is sensed from memory cells using a read operation once at a full page read mode or at a partial page read mode. A read operation of the full page read mode need not be performed according to coarse-fine sensing.

Figure 9:
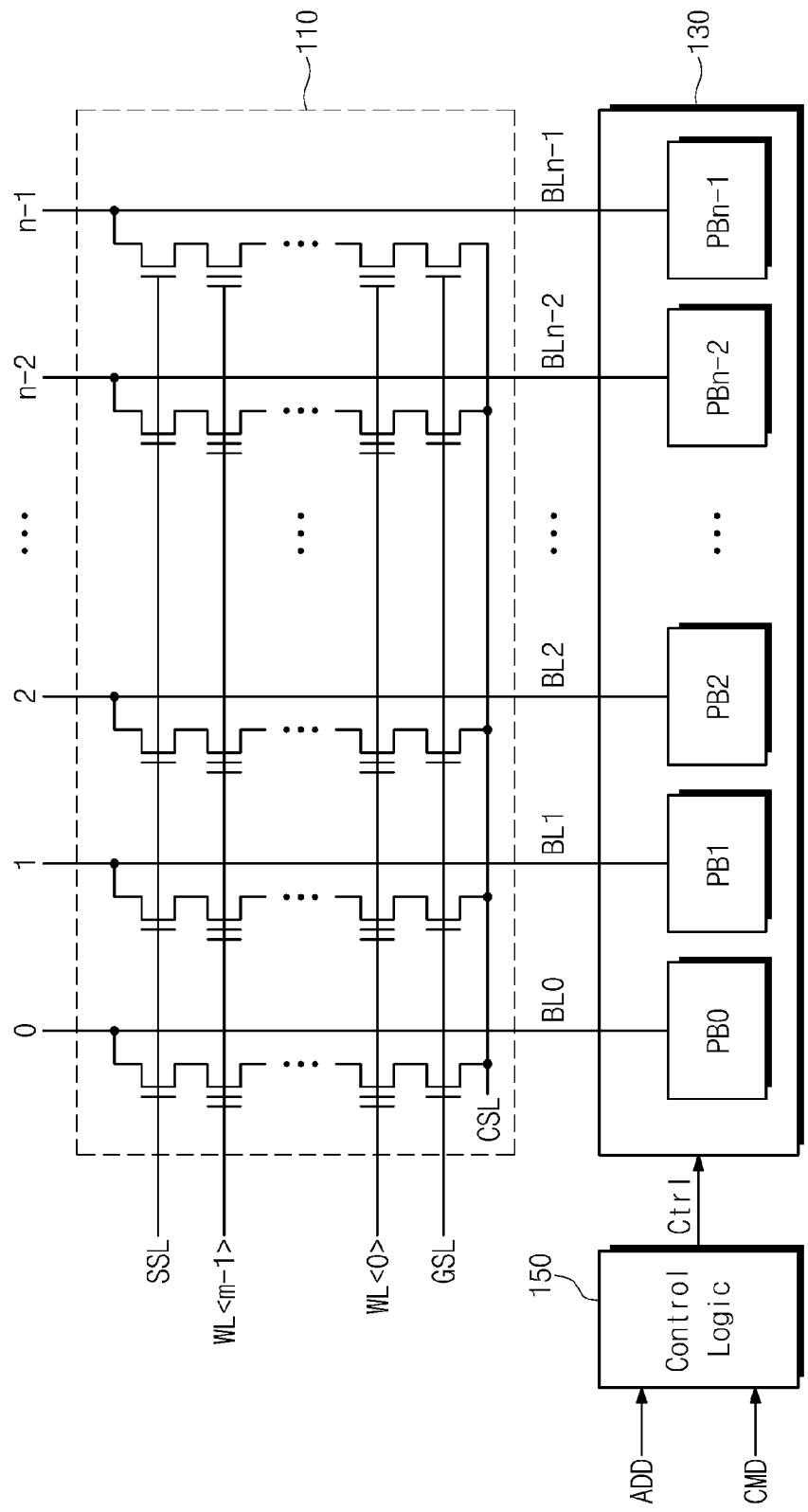
FIG. 9 is a block diagram schematically illustrating a cell array 110 and a page buffer circuit 130 shown in FIG. 1.

FIG. 9 is a block diagram schematically illustrating a cell array 110 and a page buffer circuit 130 shown in FIG. 1. Referring to FIG. 9, a cell array 110 has the ABL structure in which a bit line is connected to a page buffer.

A plurality of bit lines BL0 to BLn−1 is formed on the cell array 110. Column addresses of the cell array 110 according to at least one example embodiment of the inventive concepts are continuous (e.g., 0 to n−1). That is, bit lines are addressed to have continuous column addresses. For example, if a page has an 8-KB size, bit lines BL0 to BL8191 are addressed to column addresses 0 to 8191.

A page buffer circuit 130 includes page buffers PB0 to PBn−1 connected to bit lines BL0 to BLn−1. The page buffers PB0 to PBn−1 write data in selected memory cells via the bit lines BL0 to BLn−1 or read written data via the bit lines BL0 to BLn−1. In particular, during a verification operation and a read operation, the page buffer circuit 130 according to at least one example embodiment of the inventive concepts pre-charges all the bit lines BL0 to BLn−1 according to a control of control logic 150. During the verification operation and the read operation, the page buffer circuit 130 senses all the bit lines BL0 to BLn−1 according to a control signal Ctrl.

The control logic 150 outputs the control signal Ctrl for controlling the page buffer circuit 130 according to a full page read mode or a partial page read mode. To perform a read operation, the page buffer circuit 130 pre-charges all the bit lines BL0 to BLn−1 regardless of a read mode. The page buffer circuit 130 senses data via all the bit lines BL0 to BLn−1 regardless of a read mode. At a full page read mode, the page buffer circuit 130 outputs data sensed via all the bit lines BL0 to BLn−1. In contrast, at a partial page read mode (e.g., a half page read mode), the page buffer circuit 130 only outputs data of selected bit lines. The control logic 150 generates the control signal Ctrl in response to a command CMD or an address ADD.

With above description, during a read operation, the nonvolatile memory device 100 according to at least one example embodiment of the inventive concepts pre-charges and senses all bit lines BL0 to BLn−1 regardless of a read mode. At a read operation, the nonvolatile memory device 100 pre-charges all the bit lines BL0 to BLn−1 in the same manner as the verification operation. If all the bit lines BL0 to BLn−1 are pre-charged, common source line noise increases. Nevertheless, if bit line sensing methods for verification and read operations are unified, the page buffer circuit 130 senses memory cells via a one-time read operation; hence, a read operating speed of the nonvolatile memory device 100 is improved. With the above description, the nonvolatile memory device 100 sequentially addresses adjacent bit lines according to a physical order. When the adjacent bit lines are sequentially addressed according to a physical order and when the NOP is two or more, adjacent bit lines have the same voltage level at a program operation. If voltage levels of adjacent bit lines are identical to one another during a program operation, bit line coupling is reduced.

Figure 10:
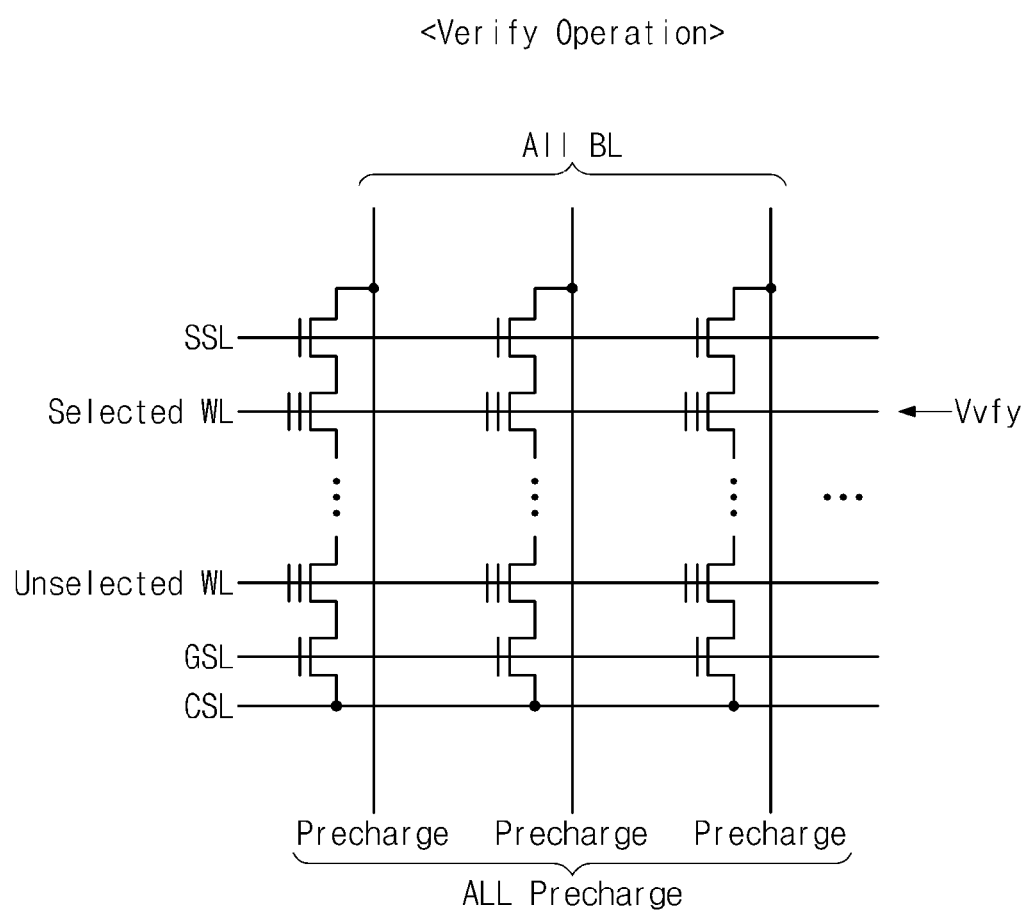
FIG. 10 is a diagram schematically illustrating a verification operation according to at least one example embodiment of the inventive concepts.

FIG. 10 is a diagram schematically illustrating a verification operation according to at least one example embodiment of the inventive concepts. Referring to FIG. 10, there is shown a nonvolatile memory device 100 addressed according to a method described with reference to FIG. 8. For example, in the event that the NOP is 2, memory cells corresponding to the front bit lines are first programmed, and memory cells corresponding to the back bit lines are next programmed.

During a verification operation, a voltage generator 160 generates a verification voltage Vvfy to be supplied to a selected word line. A page buffer circuit 130 pre-charges all bit lines. The page buffer circuit 130 performs a verification operation with respect to front bit lines or back bit lines according to the NOP of 2. During the verification operation, the page buffer circuit 130 pre-charges all bit lines regardless of selected bit lines. Thus, adjacent bit lines are sensed under a condition that they are set to the same voltage level.

Figure 11:
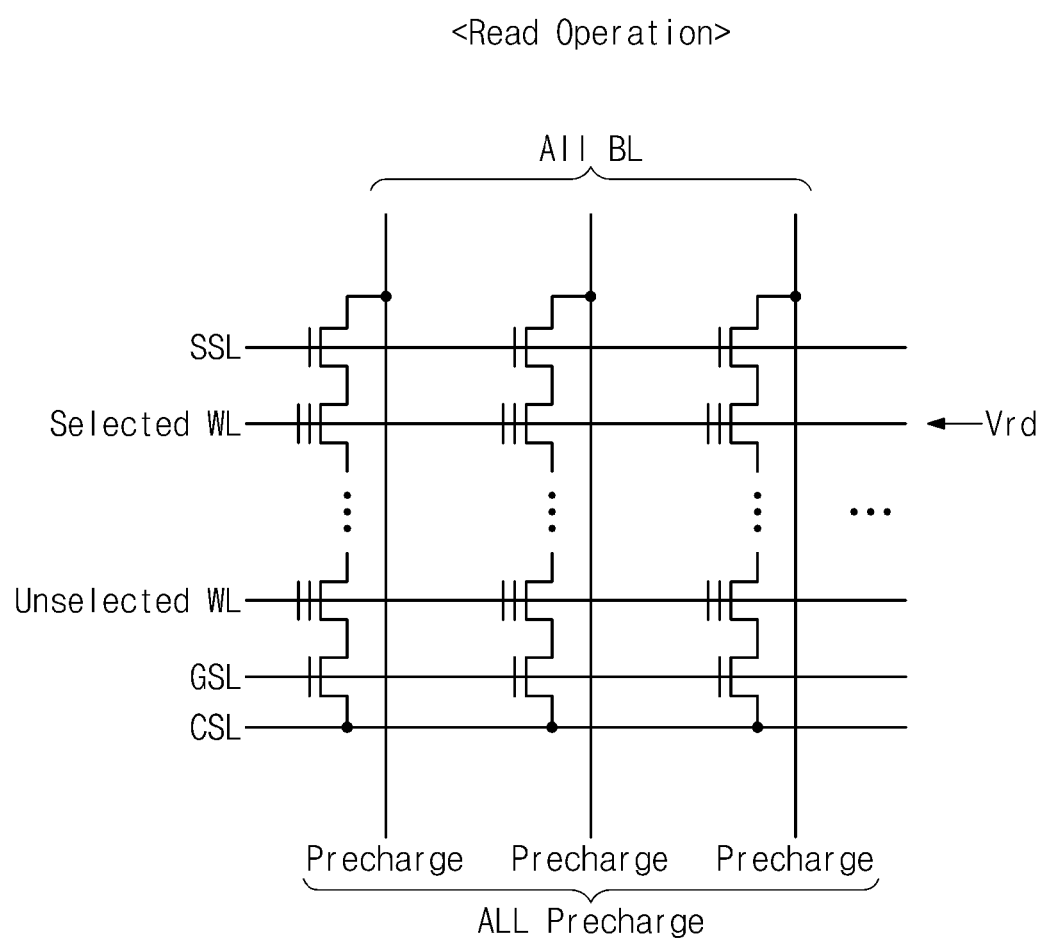
FIG. 11 is a diagram schematically illustrating a read operation according to at least one example embodiment of the inventive concepts.

FIG. 11 is a diagram schematically illustrating a read operation according to at least one example embodiment of the inventive concepts. Referring to FIG. 11, a nonvolatile memory device 100 performs a read operation in a full page read mode or a partial page read mode. The nonvolatile memory device 100 performs a verification operation according to a method described with reference to FIG. 10.

At a read operation, a voltage generator 160 generates a read voltage Vrd to be supplied to a selected word line. A page buffer circuit 130 pre-charges all bit lines. The page buffer circuit 130 senses all the bit lines. At the full page read mode, the page buffer circuit 130 outputs all sensed data. At the partial page read mode, the page buffer circuit 130 outputs data corresponding to a portion selected from the sensed data. Thus, at a read operation, the page buffer circuit 130 pre-charges all bit lines regardless of a read mode.

As described with reference to FIGS. 8 to 11, the nonvolatile memory device 100 pre-charges all bit lines in the same manner at a verification operation and at a read operation. If all bit lines BL0 to BLn−1 are pre-charged, common source line noise increases. Nevertheless, if bit line sensing methods for verification and read operations are unified, a page buffer circuit 130 senses memory cells via a one-time read operation. The reason is that a bit line sensing condition of the verification operation is equal to that of the read operation. Thus, a read operating speed of the nonvolatile memory device 100 is improved, and the nonvolatile memory device 100 sequentially addresses adjacent bit lines according to a physical order. When the adjacent bit lines are sequentially addressed according to a physical order and when the NOP is two or more, adjacent bit lines have the same voltage level at a program operation. If voltage levels of adjacent bit lines are identical to one another during a program operation, bit line coupling is reduced.

Figure 12:
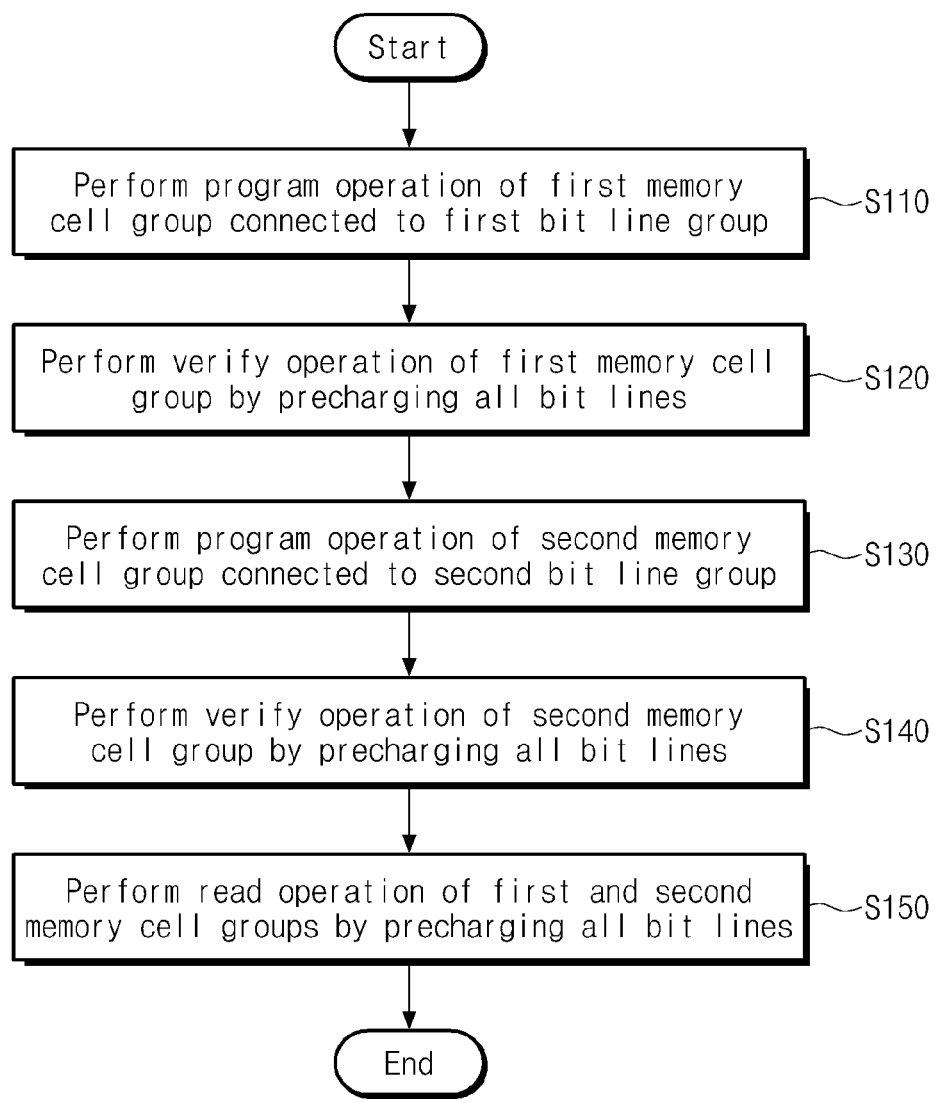
FIG. 12 is a flow chart schematically illustrating an operating method of a nonvolatile memory device according to at least one example embodiment of the inventive concepts.

FIG. 12 is a flow chart schematically illustrating an operating method of a nonvolatile memory device according to at least one example embodiment of the inventive concepts. Referring to FIG. 12, a nonvolatile memory device 100 senses memory cells under a condition that bit line pre-charging methods for verification and read operations are unified. A cell array 110 includes a first group of memory cells connected to a first bit line group and a second group of memory cells connected to a second bit line group. For example, the first bit line group includes front bit lines, and the second bit line group includes back bit lines. The first and second bit line groups may include adjacent bit lines. Bit lines in the first and second bit line groups are addressed to logical addresses according to a physical order as described with reference to FIG. 8. Below, an operating method of the nonvolatile memory device 100 will be described under a condition that the NOP is 2. However, at least some example embodiments of the inventive concepts are not limited thereto. Also, it is assumed that a page has an 8-KB size.

In step S110, the nonvolatile memory device 100 performs a program operation with respect to the first memory cell group connected to the first bit line group. For example, the nonvolatile memory device 100 first programs front data with a 4-KB size in a selected word line.

In step S120, the nonvolatile memory device 100 pre-charges all bit lines BL0 to BLn−1 to perform a verification operation with respect to the first memory cell group. For example, the nonvolatile memory device 100 performs the verification operation with respect to the front data with a 4-KB size programmed in step S110. The nonvolatile memory device 100 pre-charges all the bit lines BL0 to BLn−1 to perform the verification operation. Thus, the nonvolatile memory device 100 performs sensing method in a unified manner with respect to the verification operation of step S120.

In step S130, the nonvolatile memory device 100 performs a program operation with respect to the first memory cell group connected to the second bit line group. For example, the nonvolatile memory device 100 next programs back data with a 4-KB size in the selected word line. The back data may be programmed after the front data is programmed.

In step S140, the nonvolatile memory device 100 pre-charges all the bit lines BL0 to BLn−1 to perform a verification operation about the second memory cell group.

For example, the nonvolatile memory device 100 performs the verification operation about the back data with a 4-KB size programmed in step S130. The nonvolatile memory device 100 pre-charges all the bit lines BL0 to BLn−1 to perform the verification operation. Thus, the nonvolatile memory device 100 performs sensing method in a unified manner with respect to the verification operation of step S140.

At a read operation, in step S150, the nonvolatile memory device 100 pre-charges all the bit lines BL0 to BLn−1 to perform a read operation with respect to the first and second memory cell groups. For example, at the read operation, the nonvolatile memory device 100 pre-charges all the bit lines BL0 to BLn−1 to sense all memory cells connected to the selected word line. The nonvolatile memory device 100 outputs data of memory cells, corresponding to a read request, from among sensed memory cells. The nonvolatile memory device 100 may output data of all memory cells connected to the selected word line. Also, the nonvolatile memory device 100 outputs data of memory cells corresponding to the first or second memory cell group.

As described above, the nonvolatile memory device 100 pre-charges all bit lines BL0 to BLn−1 in the same manner both at a read operation and at a verification operation. If all bit lines BL0 to BLn−1 are pre-charged, then common source line noise increases. Nevertheless, if the bit line sensing methods for the verification operation is unified, a page buffer circuit 130 senses memory cells by performing a sensing operation once with respect to the verification operation, and if the bit line sensing method for the read operation is unified, a page buffer circuit 130 senses memory cells by performing a sensing operation once with respect to the reading operation. The reason is that bit line sensing conditions of the verification and read operations are equal to each other. Hence, a read operating speed of the nonvolatile memory device 100 is improved. With the above description, the nonvolatile memory device 100 sequentially addresses adjacent bit lines according to a physical order. When the adjacent bit lines are sequentially addressed according to a physical order and when the NOP is two or more, adjacent bit lines have the same voltage level at a program operation. If voltage levels of adjacent bit lines are identical to one another during a program operation, bit line coupling is reduced.

Figure 13:
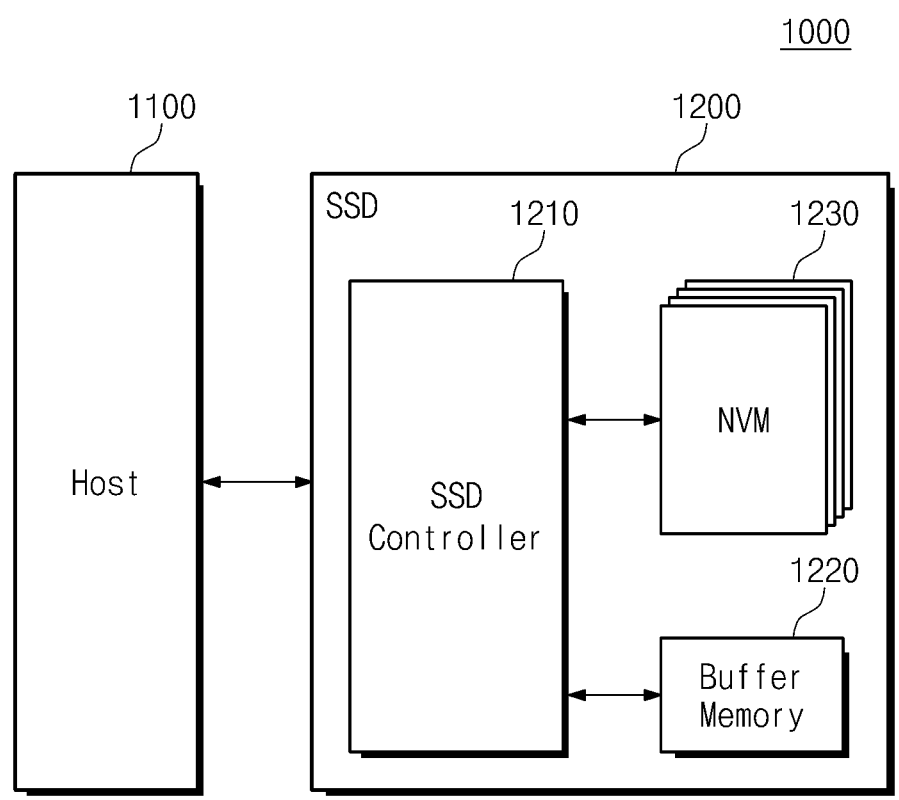
FIG. 13 is a block diagram illustrating a user device including a solid state drive according to at least one example embodiment of the inventive concepts.

FIG. 13 is a block diagram illustrating a user device including a solid state drive according to at least one example embodiment of the inventive concepts. Referring to FIG. 13, a user device 1000 includes a host 1100 and a solid state drive (hereinafter, referred to as SSD) 1200. The SSD 1200 includes an SSD controller 1210, a buffer memory 1220, and a nonvolatile memory device 1230.

The SSD controller 1210 may provide physical interconnection between the host 1100 and the SSD 1200. The SSD controller 1210 provides an interface with the SSD 1200 corresponding to a bus format of the host 1100. In particular, the SSD controller 1210 decodes a command provided from the host 1100 and accesses the nonvolatile memory device 1230 based on the decoding result. The bus format of the host 1100 may include USB (Universal Serial Bus), SCSI (Small Computer System Interface), PCI express, ATA, PATA (Parallel ATA), SATA (Serial ATA), SAS (Serial Attached SCSI), and the like.

The SSD controller 1210 decodes a read request from the host 1100 to select one of a partial page read mode and a full page read mode. The SSD controller 1210 controls the nonvolatile memory device 1230 so as to access memory cells according to a corresponding read mode. For example, the SSD controller 1210 controls the nonvolatile memory device 1230 so as to establish a specific read command (e.g., a partial page read command) or a set feature.

The buffer memory 1220 temporarily stores write data provided from the host 1100 or data read out from the nonvolatile memory device 1230. In the event that data existing in the nonvolatile memory device 1230 is cached, at a read request of the host 1100, the buffer memory 1220 supports a cache function to provide cached data directly to the host 1100. Typically, a data transfer speed of a bus format (e.g., SATA or SAS) of the host 1100 may be higher than that of a memory channel of the SSD 1200. That is, in the event that an interface speed of the host 1100 is much faster, lowering of the performance due to a speed difference may be reduced or, alternatively, minimized by providing the buffer memory 1220 with a large storage capacity.

The buffer memory 1220 may be formed of a synchronous DRAM to provide sufficient buffering to the SSD 1200 used as an auxiliary mass storage device. However, at least some example embodiments of the inventive concepts are not limited thereto.

The nonvolatile memory device 1230 may be provided as storage media of the SSD 1200. For example, the nonvolatile memory device 1230 may be formed of a NAND flash memory with mass storage capacity. For example, according to at least one example embodiment, the nonvolatile memory device 1230 may have the same structure and operation as the nonvolatile memory device 100 described above with reference to FIGS. 1-12. The nonvolatile memory device 1230 pre-charges all bit lines BL0 to BLn−1 in the same manner both at a read operation and at a verification operation. If all bit lines BL0 to BLn−1 are pre-charged, then common source line noise increases. Nevertheless, if bit line sensing methods for verification and read operations are unified, the nonvolatile memory device 1230 senses memory cells by performing a read operation once. The reason is that bit line sensing conditions of the verification and read operations are equal to each other. Hence, a read operating speed of the nonvolatile memory device 1230 is improved. With the above description, the nonvolatile memory device 1230 sequentially addresses adjacent bit lines according to a physical order. When the adjacent bit lines are sequentially addressed according to a physical order and when the NOP is two or more, adjacent bit lines have the same voltage level at a program operation. If voltage levels of adjacent bit lines are identical to one another during a program operation, bit line coupling is reduced.

The nonvolatile memory device 1230 may be formed of a plurality of memory devices. In this case, memory devices may be connected with the SSD controller 1210 by the channel. There is described an embodiment where as a storage medium, the nonvolatile memory device 1230 is formed of a NAND flash memory. However, the nonvolatile memory device 1230 is not limited to a NAND flash memory device. For example, a storage medium of the SSD 1200 may be formed of a PRAM, an MRAM, a ReRAM, a FRAM, a NOR flash memory, and the like. Further, at least some example embodiments of the inventive concepts may be applied to a memory system that uses different types of memory devices together.

Figure 14:
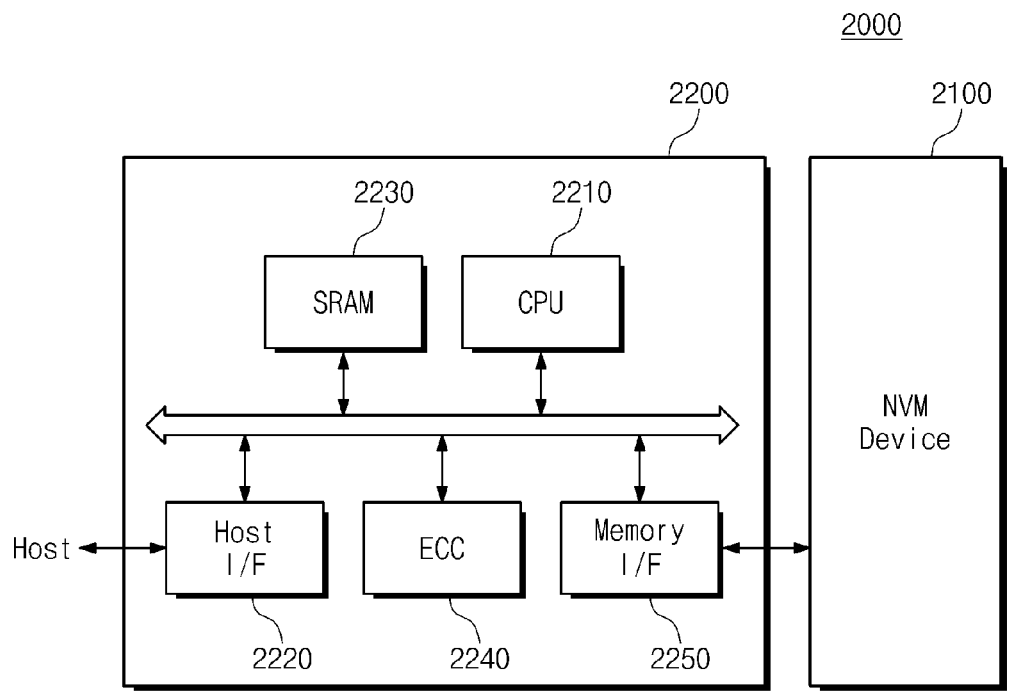
FIG. 14 is a block diagram illustrating a memory system according to at least one example embodiment of the inventive concepts.

FIG. 14 is a block diagram illustrating a memory system according to at least one example embodiment of the inventive concepts. Referring to FIG. 14, a memory system 2000 includes a nonvolatile memory 2100 and a flash controller 2200.

The nonvolatile memory 2100 is configured the same or, alternatively, substantially the same as a nonvolatile memory 100 shown in FIG. 1, and a description thereof is thus omitted. For example, the nonvolatile memory device 2100 may have the same structure and operation as the nonvolatile memory device 100 described above with reference to FIGS. 1-12. The nonvolatile memory 2100 pre-charges all bit lines BL0 to BLn−1 in the same manner both at a read operation and at a verification operation. If all bit lines BL0 to BLn−1 are pre-charged, then common source line noise increases. Nevertheless, if bit line sensing methods for verification and read operations are unified, the nonvolatile memory 2100 senses memory cells by performing a read operation once. The reason is that bit line sensing conditions of the verification and read operations are equal to each other. Hence, a read operating speed of the nonvolatile memory 2100 is improved. With the above description, the nonvolatile memory 2100 sequentially addresses adjacent bit lines according to a physical order. When the adjacent bit lines are sequentially addressed according to a physical order and when the NOP is two or more, adjacent bit lines have the same voltage level at a program operation. If voltage levels of adjacent bit lines are identical to one another during a program operation, bit line coupling is reduced.

The memory controller 2200 may be configured to control the nonvolatile memory 2100. For example, the memory controller 2200 is configured to control read, write, erase, and background operations of the nonvolatile memory 2100. An SRAM 2230 may be used as a working memory of a CPU 2210. A host interface 2220 may include a data exchange protocol of a host connected with the memory system 2000. An ECC block 2240 may be configured to detect and correct errors included in data read out from the nonvolatile memory 2100. A memory interface 2260 may interface with the nonvolatile memory 2100 according to at least one example embodiment of the inventive concepts. The CPU 2210 may execute an overall control operation for data exchange of the memory controller 2200. Although not shown in FIG. 14, the memory system 2000 may further include ROM which stores code data for interfacing with the host.

The memory controller 2200 may communicate with an external device (e.g., host) via one of interface protocols such as USB, MMC, PCI-E, SAS, SATA, PATA, SCSI, ESDI, IDE, and the like.

The memory controller 2200 decodes a read request from the host to select one of a partial page read mode and a full page read mode. The memory controller 2200 controls the nonvolatile memory 2100 so as to access memory cells according to a corresponding read mode. For example, the memory controller 2200 controls the nonvolatile memory 2100 so as to establish a specific read command (e.g., a partial page read command) or a set feature.

In example embodiments, the memory system 2000 may be embodied as computer, portable computer, Ultra Mobile PC (UMPC), workstation, net-book, PDA, web tablet, wireless phone, mobile phone, smart phone, e-book, PMP (portable multimedia player), digital camera, digital audio recorder/player, digital picture/video recorder/player, portable game machine, navigation system, black box, 3-dimensional television, a device capable of transmitting and receiving information at a wireless circumstance, one of various electronic devices constituting home network, one of various electronic devices constituting computer network, one of various electronic devices constituting telematics network, RFID, or one of various electronic devices constituting a computing system.

Figure 15:
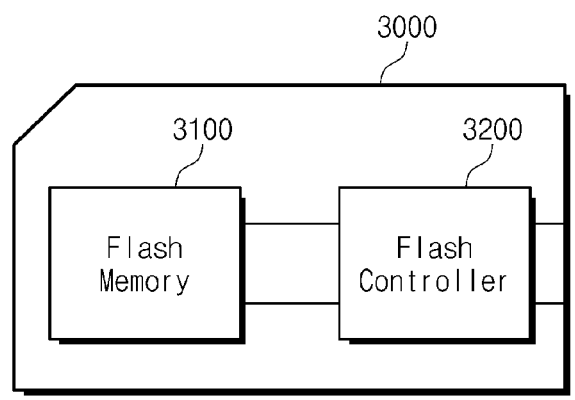
FIG. 15 is a block diagram schematically illustrating a data storage device 3000 according to at least one example embodiment of the inventive concepts.

FIG. 15 is a block diagram schematically illustrating a data storage device 3000 according to at least one example embodiment of the inventive concepts. Referring to FIG. 15, a data storage device 3000 according to at least one example embodiment of the inventive concepts includes a flash memory 3100 and a flash controller 3200. The flash controller 3200 controls the flash memory 3100 based on control signals provided from an external device.

Also, the flash memory 3100 is configured the same or, alternatively, substantially the same as a nonvolatile memory device 100 shown in FIG. 1, and the flash memory 3100 is one of a stack flash structure in which arrays are stacked at multiple layers, a source-drain free flash structure, a pin-type flash structure, and the like. For example, the flash memory 3100 may have the same structure and operation as the nonvolatile memory device 100 described above with reference to FIGS. 1-12. The flash memory 3100 pre-charges all bit lines BL0 to BLn−1 in the same manner both at a read operation and at a verification operation. If all bit lines BL0 to BLn−1 are pre-charged, then common source line noise increases. Nevertheless, if bit line sensing methods for verification and read operations are unified, the flash memory 3100 senses memory cells by performing a read operation once. The reason is that bit line sensing conditions of the verification and read operations are equal to each other. Hence, a read operating speed of the flash memory 3100 is improved. With the above description, the flash memory 3100 sequentially addresses adjacent bit lines according to a physical order. When the adjacent bit lines are sequentially addressed according to a physical order and when the NOP is two or more, adjacent bit lines have the same voltage level at a program operation. If voltage levels of adjacent bit lines are identical to one another during a program operation, bit line coupling is reduced.

The flash controller 3200 decodes a read request from a host to select one of a partial page read mode and a full page read mode. The flash controller 3200 controls the nonvolatile memory 3100 so as to access memory cells according to a corresponding read mode. For example, the flash controller 3200 controls the nonvolatile memory 3100 so as to establish a specific read command (e.g., a partial page read command) or a set feature.

The data storage device 3000 may be a memory card device, an SSD device, a multimedia card device, an SD device, a memory stick device, a HDD device, a hybrid drive device, or an USB flash device. For example, the data storage device 3000 may be a card which satisfies the industrial standards for using a user device such as a digital camera, a personal computer, and the like.

Figure 16:
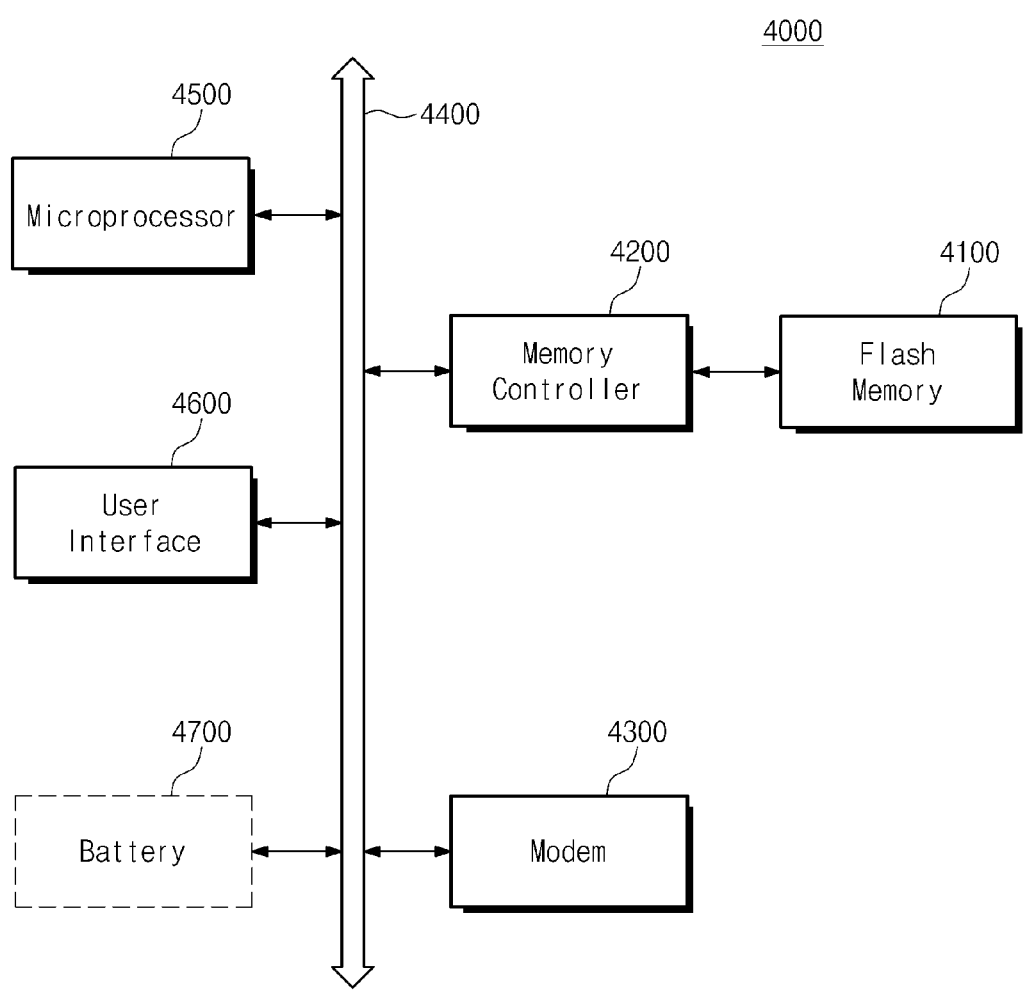
FIG. 16 is a block diagram schematically illustrating a computing system including a flash memory device 4100 according to at least one example embodiment of the inventive concepts.

FIG. 16 is a block diagram schematically illustrating a computing system 4000 including a flash memory device 4100 according to at least one example embodiment of the inventive concepts. Referring to FIG. 16, a computing system 4000 according to at least one example embodiment of the inventive concepts includes a flash memory device 4100, a memory controller 4200, a modem 4300 such as a baseband chip, a microprocessor 4500, and a user interface 4600, which are electrically connected to a system bus 4400.

The flash memory device 4100 is the same or, alternatively, substantially the same as a nonvolatile storage device 100 illustrated in FIG. 1, and the flash memory device 4100 is one of a stack flash structure in which arrays are stacked at multiple layers, a source-drain free flash structure, a pin-type flash structure, and the like. For example, the flash memory device 4100 may have the same structure and operation as the nonvolatile memory device 100 described above with reference to FIGS. 1-12.

The flash memory device 4100 pre-charges all bit lines BL0 to BLn−1 in the same manner both at a read operation and at a verification operation. If all bit lines BL0 to BLn−1 are pre-charged, then common source line noise increases. Nevertheless, if bit line sensing methods for verification and read operations are unified, the flash memory device 4100 senses memory cells by performing a read operation once. The reason is that bit line sensing conditions of the verification and read operations are equal to each other. Hence, a read operating speed of the flash memory device 4100 is improved. With the above description, the flash memory device 4100 sequentially addresses adjacent bit lines according to a physical order. When the adjacent bit lines are sequentially addressed according to a physical order and when the NOP is two or more, adjacent bit lines have the same voltage level at a program operation. If voltage levels of adjacent bit lines are identical to one another during a program operation, bit line coupling is reduced.

If the computing system 4000 is a mobile device, it further includes a battery 4700 for supplying an operating voltage to the computing system 4000. Although not show in figures, the computing system 4000 may further include an application chipset, a Camera Image Processor (CIS), a mobile DRAM, etc. The memory controller 4200 and the flash memory device 4100 may constitute a solid state drive/disk that uses a nonvolatile memory to store data.

A non-volatile memory device and/or a memory controller according to at least one example embodiment of the inventive concepts may be packaged according to any of a variety of different packaging technologies. Examples of such packaging technologies include PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

Example embodiments having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:

1. A nonvolatile memory device comprising:
   a plurality of memory cells including,
      a first memory cell group connected to a first word line and a first bit line group, bit lines in the first bit line group being adjacent to each other,
      a second memory cell group connected to the first word line and a second bit line group, bit lines in the second bit line group being adjacent to each other;
   a page buffer circuit configured to sense memory cells connected to the first word line via the first and second bit line groups; and
   a control logic configured to perform a first program operation with respect to the first memory cell group and perform a second program operation with respect to the second memory cell group,
   the control logic being configured such that after the control logic performs the first program operation with respect to the first memory cell group, the control logic performs a first verification operation with respect to the first memory cell group by pre-charging bit lines in the first and second bit line groups at a first same time to verify the first program operation,
   the control logic being configured such that after the control logic performs the second program operation with respect to the second memory cell group, the control logic performs a second verification operation with respect to the second memory cell group by pre-charging the bit lines in the first and second bit line groups at a second same time to verify the second program operation,
   the control logic being configured such that, when the control logic performs a read operation on at least one of the first memory cell group and the second memory cell group, the control logic simultaneously pre-charges the bit lines in the first and second bit line groups to perform the read operation.

2. The nonvolatile memory device of claim 1, wherein the number of bit lines in the first bit line group is equal to the number of bit lines in the second bit line group.

3. The nonvolatile memory device of claim 1, wherein the control logic is configured to control the page buffer circuit according to a reference number of program operations (NOP) such that, when the NOP is 2 or greater, the first memory group is first programmed and the second memory cell group is next programmed.

4. The nonvolatile memory device of claim 1, wherein the control logic is configured such that, during the read operation, the control logic controls the page buffer circuit so as to sense the first and second memory cell groups and to output the sensed result according to a full page read mode or a partial page read mode.

5. The nonvolatile memory device of claim 4, wherein the control logic is configured such that, when the control logic controls the page buffer to output the sensed result according to the partial page read mode, the control logic controls the page buffer circuit to simultaneously pre-charge and sense the bit lines of the first and second bit line groups.

6. The nonvolatile memory device of claim 5, wherein the control logic is configured such that, when the control logic controls the page buffer to output the sensed result according to the partial page read mode, the control logic controls the page buffer circuit to output data sensed from a selected one of the first and second memory cell groups, the selected one being indicated by a read request.

7. The nonvolatile memory device of claim 1, wherein the control logic is configured to allocate first physical addresses to the bit lines of the first bit line group and configured to allocate second physical addresses to the bit lines of the second bit line group.

8. The nonvolatile memory device of claim 7, wherein the control logic is configured such that the first physical addresses are sequentially addressed to first logical addresses of write-requested data.

9. The nonvolatile memory device of claim 8, wherein the control logic is configured such that,
   the second physical addresses are sequentially addressed second logical addresses of write-requested data, and
   the second logical addresses are addressed following the first logical addresses.

10. An operating method of a nonvolatile memory device which includes a first memory cell group that is connected to a selected word line and a first bit line group, bit lines in the first bit line group being adjacent to each other; a second memory cell group that is connected to the selected word line and a second bit line group, bit lines in the second bit line group being adjacent to each other; a page buffer circuit configured to sense memory cells connected to the selected word line via the first and second bit line groups; and control logic configured to control the page buffer circuit, the operating method comprising:

performing a first program operation with respect to the first memory cell group;

pre-charging bit lines in the first and second bit line groups at the same time to perform a first verification operation with respect the first memory cell to verify the first program operation, after performing the first program operation;

performing a second program operation with respect to the second memory cell group, after verifying the first program operation;

pre-charging the bit lines in the first and second bit line groups at the same time to perform a second verification operation with respect to the second memory cell to verify the second program operation, after performing the second program operation; and performing a read operation, the read operation including simultaneously pre-charging the bit lines in the first and second bit line groups.

11. The operating method of claim 10, further comprising assigning the first and second bit line groups such that the number of bit lines in the first bit line group is equal to the number of bit lines in the second bit line group.

12. The operating method of claim 10, wherein based on a reference number of program operations (NOP), the first memory group is first programmed and the second memory cell group is next programmed.

13. The operating method of claim 10, wherein performing the read operation further includes, outputting data stored in the first and second memory cell groups according to a full page read mode or a partial page read mode.

14. The operating method of claim 13, wherein outputting the data according to the partial page read mode includes,
sensing all data stored in the first and second memory cell groups, and
outputting data, corresponding to one of the first or second memory cell group, from among the sensed data.

15. The operating method of claim 10, further comprising:
allocating logical addresses such that physical addresses of the first and second bit line groups are sequentially addressed to logical addresses of write-requested data.

16. A nonvolatile memory device comprising:
a plurality of memory cells including,
a first group of memory cells having adjacent first bit lines, respectively, and each being connected to a first word line, and
a second group of memory cells having adjacent second bit lines, respectively, and each being connected to the first word line; and
a control circuit configured to control performance of,
a first program operation to program the first group of memory cells,
a first verification operation to verify the first program operation,
a second program operation to program the second group of memory cells, after the first verification operation,
a second verification operation to verify the second program operation, and
a read operation to read data from one or more cells from at least one of the first and second groups of memory cells,
the control circuit being configured control performance of a unified pre-charge operation during each of the first verification operation, the second verification operation, and the read operation, respectively,
the unified pre-charge operation being a pre-charge operation in which both the adjacent first bit lines and the adjacent second bit lines are pre-charged at the same time.

17. The nonvolatile memory device of claim 16, further comprising:
a page buffer connected to the first and second adjacent bit lines,
the control circuit being configured to control the page buffer to perform the first, second and third unified pre-charging operations.

18. The nonvolatile memory device of claim 16 wherein the read operation is a partial-read operation that includes outputting selected data read from only a selected group, the selected group being only one of the first group of memory cells and the second group of memory cells, the selected data being read based on the third unified pre-charge operation.

* * * * *